United States Patent
Gerlach et al.

(10) Patent No.: US 10,074,797 B2
(45) Date of Patent: Sep. 11, 2018

(54) METHOD FOR ELECTRICALLY CONTACTING A PIEZOELECTRIC CERAMIC

(71) Applicant: Robert Bosch GmbH, Stuttgart (DE)

(72) Inventors: Andre Gerlach, Leonberg-Hoefingen (DE); Guenter Gerlach, Rastatt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 327 days.

(21) Appl. No.: 14/899,918

(22) PCT Filed: May 26, 2014

(86) PCT No.: PCT/EP2014/060765
§ 371 (c)(1),
(2) Date: Dec. 18, 2015

(87) PCT Pub. No.: WO2014/202336
PCT Pub. Date: Dec. 24, 2014

(65) Prior Publication Data
US 2016/0141488 A1    May 19, 2016

(30) Foreign Application Priority Data
Jun. 20, 2013 (DE) .......................... 10 2013 211 596

(51) Int. Cl.
*H01L 41/29* (2013.01)
*B06B 1/06* (2006.01)

(52) U.S. Cl.
CPC ............... *H01L 41/29* (2013.01); *B06B 1/06* (2013.01); *B06B 1/0622* (2013.01); *B06B 1/0662* (2013.01)

(58) Field of Classification Search
CPC ......... H01L 41/29; B06B 1/06; B06B 1/0622; B06B 1/0625; B06B 1/0633; B06B 1/0637
(Continued)

(56) References Cited

U.S. PATENT DOCUMENTS 4,786,837 A * 11/1988 Kalnin ................. B06B 1/0688
                                                      310/330
5,836,192 A * 11/1998 Getman .................... B06B 1/06
                                                      340/621
(Continued)

FOREIGN PATENT DOCUMENTS

CN           1191326 A         8/1998
CN         101231395 A         7/2008
(Continued)

*Primary Examiner* — Bryan Gordon
(74) *Attorney, Agent, or Firm* — Norton Rose Fulbright US LLP; Gerard Messina

(57) ABSTRACT

A method for electrically contacting a piezoelectric ceramic includes: providing the piezoelectric ceramic having electrodes for electrically contacting the piezoelectric ceramic and having a flexible, electrically conductive film; producing a composite by applying the flexible, electrically conductive film at least partially to an electrode of the piezoelectric ceramic; forming a durable, electrically conductive connection between the flexible, electrically conductive film and the electrode of the piezoelectric ceramic. Also a sound transducer, as well as a sound transducer array produced using the method for electrically contacting a piezoelectric ceramic.

5 Claims, 3 Drawing Sheets

(58) Field of Classification Search
USPC .................................................. 310/334, 336
See application file for complete search history.

(56) References Cited

U.S. PATENT DOCUMENTS

| | | |
|---|---|---|
| 6,037,707 A | 3/2000 | Gailus et al. |
| 2002/0114217 A1* | 8/2002 | Killam .................. H04R 17/00 367/140 |
| 2003/0107303 A1 | 6/2003 | Mohr et al. |
| 2009/0033585 A1* | 2/2009 | Lang .................... B23K 20/005 343/906 |
| 2011/0140576 A1* | 6/2011 | Sawada .................... A61B 8/12 310/334 |
| 2012/0091863 A1* | 4/2012 | Kitayama .................. C09J 9/02 310/365 |

FOREIGN PATENT DOCUMENTS

| | | |
|---|---|---|
| CN | 102782893 A | 11/2012 |
| CN | 102790168 A | 11/2012 |
| DE | 10 2005 038 416 | 9/2006 |
| DE | 102005021275 A1 | 11/2006 |
| DE | 10 2009 040 374 | 3/2011 |
| DE | 10 2011 077 553 | 12/2012 |
| EP | 0 853 919 | 7/1998 |
| JP | 2012089587 A | 5/2012 |
| WO | WO 2010/018525 | 2/2010 |

\* cited by examiner

METHOD FOR ELECTRICALLY CONTACTING A PIEZOELECTRIC CERAMIC

FIELD OF THE INVENTION

The present invention relates to a method for electrically contacting a piezoelectric ceramic. The present invention also relates to a sound transducer having a piezoelectric ceramic that is contacted accordingly and an ultrasonic array having such sound transducers.

BACKGROUND INFORMATION

Today's ultrasonic parking systems are based on ultrasonic sensors that function in transmission/reception operation and are integrated as distributed systems in the rear and/or front bumpers. In each particular case, four to six such sensors are configured and vertically oriented in the front and rear in a way that allows the individual sound fields to cover the entire space in front of and to the rear of the vehicle. No ground reflections are captured. Systems of this kind have a decisive warning function when an object is detected in the sound space. To improve the functionality of such ultrasound-based systems, more recent applications employ array sensors, which include a matrix or a line of a plurality of ultrasonic sensors.

The European Patent Application EP 0 853 919 A2 discusses a configuration of ultrasonic sensors that encompasses a flexible material including printed conductors. Provided on the flexible material are ultrasonic elements and integrated electronics that are interconnected via signal lines on the flexible material.

The German Patent Application DE 10 2011 077 553 A1 discusses an ultrasound transducer having a piezoelectric ceramic, a printed circuit board and a pot-shaped diaphragm. The piezoelectric ceramic is fastened to a front side of the pot-shaped diaphragm. The piezoelectric ceramic is also connected via at least two lines to signal terminals of the printed circuit board, the signal terminals being provided on a section of the printed circuit board in the interior of the pot-shaped diaphragm. The lines themselves are configured as wires or as single-wire stranded cables.

The German Patent Application DE 10 2009 040 374 A1 discusses an ultrasound transducer having a decoupling ring for attenuating mechanical vibrations that is configured between a shielded, conductive housing and a vibration generating diaphragm. The decoupling ring is made of a conductive material and establishes a conductive connection between the diaphragm and the ground potential.

During manufacture of such sensor systems, the piezoelectric ceramics are contacted using methods such as thermocompression welding. However, they are not easy to replace during assembly of ultrasonic arrays since the contacting must be carried out very precisely and within the smallest possible space. In addition, weak spots can occur in the case of contacts that are produced by thermocompression welding. Such weak spots diminish the quality of the contacting and the service life of such sensors. Therefore, there is continued interest in providing a contacting method for sensors, in particular sound transducers, that makes the contacting of the individual sensor elements simple, reliable and cost-effective.

SUMMARY OF THE INVENTION

In accordance with the present invention, a method is provided for electrically contacting a piezoelectric ceramic that includes the following steps:

a) providing the piezoelectric ceramic having electrodes for electrically contacting the piezoelectric ceramic and having a flexible, electrically conductive film;

b) producing a composite by applying the flexible, electrically conductive film at least partially to an electrode of the piezoelectric ceramic;

c) forming a durable, electrically conductive connection between the flexible, electrically conductive film and the electrode of the piezoelectric ceramic.

The method according to the present invention makes possible a stable and rugged contacting of the piezoelectric ceramic by employing a flexible, electrically conductive film. A reliable contacting may be thereby provided that enhances the service life and reliability of systems in which a piezoelectric ceramic contacted in this manner is used, in particular for applications in the automotive sector where the vibration and temperature loads are often high. In addition, the method is simple and reliable to implement. Thus, a cost-effective method is provided that achieves a high process reliability and is suited for the volume-production sector.

The method according to the present invention is especially suited for manufacturing sound transducers, such as ultrasound transducers, which convert sound waves via the piezoelectric ceramic into a voltage signal, i.e., for detecting the same, or which emit sound waves by applying a voltage to the piezoelectric ceramic. Thus, the method according to the present invention is especially suited for manufacturing thickness resonators or flexural resonators.

To manufacture a sound transducer, the piezoelectric ceramic may initially be contacted in accordance with the method of the present invention and be subsequently introduced into a transducer element. Alternatively, the piezoelectric ceramic may be introduced into the transducer element and subsequently contacted. Also possible are combinations of these method steps where the piezoelectric ceramic is partially contacted, then introduced into the transducer element, and the further contacting of the piezoelectric ceramic is subsequently carried out.

In the process, the transducer element may be adapted to the form of the sound transducer. For example, the transducer element of a flexural resonator is configured as a pot-shaped transducer, onto whose bottom inner side, the piezoelectric ceramic is introduced. In the case of thickness resonators, the transducer element includes two transducer bodies, between which the piezoelectric ceramic is introduced.

In the present case, a piezoelectric ceramic refers to a ceramic material that deforms under the action of an external force, for example, in response to ultrasonic waves, and this deformation results in a charge separation. Piezoelectric ceramics may be obtained that are based on different materials. Examples include lead zirconate—lead titanate (PZT), or piezoelectric ceramics, such as Morgan Electro Ceramics PZT-5A or CeramTec P5. The piezoelectric ceramic may have a flat form, i.e., the aspect ratio between length or width and thickness is at least 2, which may be 8-40, especially 20. In addition, the piezoelectric ceramic may have any desired geometric shape. For example, it may be round, rectangular, elliptical or square.

The flexible film includes a backing sheet, an adhesive layer, as well as an electrically conductive layer; it may have a thickness of between 20 µm and 250 µm, which may be of between 30 µm and 230 µm, and especially of between 40 µm and 90 µm. In addition, the film maybe temperature-resistant up to a temperature of what may be 250° C. As a backing sheet, the flexible film may include a polyimide- or PET- or PEN-based plastic film, for example. Polyimide films of this kind may be obtained under the name Kapton®, for example.

To design the flexible film to be electrically conductive, it may be coated on one or two sides with an electrically conductive material. The coating may be uniformly applied to the flexible film or be imprinted in printed conductors. A metal, such as copper, gold, aluminum or gold alloys, maybe used as a coating material. By coating the flexible film with an electrically conductive material, contacting surfaces are formed on the flexible film that may be connected, which may be directly, with the electrodes of the piezoelectric ceramic. In addition, the mass input of the contacting through the flexible, electrically conductive film is minimal. Therefore, the vibrational properties essentially remain unaffected, especially when the contacting concept is applied in sound transducers.

To form the composite, one specific embodiment provides that a conductive adhesive or a solder paste be applied between the flexible, electrically conductive film and the electrode of the piezoelectric ceramic. The solder paste may be a solder metal powder, for example, based on copper, tin, silver or mixtures thereof, and contain a fluxing agent. Anisotropic or isotropic conductive adhesives may be used as conductive adhesives. Anisotropic conductive adhesives contain an epoxy resin, for example, which may contain 10 to 20% by weight of metallic spheres relative to the epoxy resin. Spheres of this kind may have a size of 5 µm to 50 µm, which may be of 8 µm to 25 µm. Isotropic conductive adhesives may likewise be formed on the basis of an epoxy resin containing metallic platelets having a length or width of 30 µm to 70 µm and an aspect ratio to thickness of 5; likewise possible are isotropic conductive adhesives having metallic spheres; the metal content in % by weight being greater in the case of anisotropic conductive adhesives, for example, within the range of 20 to 7% by weight. Silver or aluminum or a composite of a metal having an outer nickel layer or only nickel is suited as metal for the spheres or the platelets, for example.

In a further specific embodiment, heat and/or pressure is introduced into the composite using a thermode to produce the durable, electrical connection between the electrode of the piezoelectric ceramic and the flexible, electrical film. By using heat and/or pressure, short production cycles may be achieved that make the method suited for large-scale production. For that purpose, the thermode may have at least one thermode head having at least one contact surface that introduces heat and/or pressure into the composite. In addition, the thermode head may include a plurality of contact surfaces in a specific geometry. Thus, the thermode head may include round, rectangular, elliptical or square contact surfaces, for example, or contact surfaces of different geometries, and also be subdivided. In another specific embodiment, the thermode head includes a heating for introducing heat into the composite and a rear spring for introducing pressure in the form of contact pressure. Each contact surface of the thermode head may be individually resiliently mounted from behind in order to suitably compensate for tolerances.

The thermode makes it possible to provide a completely automated method that is readily adaptable to different requirements. Thus, individual sound transducers may be manufactured using a suitably configured thermode head just as easily as sound transducer arrays in which a plurality of sound transducers maybe disposed in a matrix. In addition, the contacting technique makes possible a low-ohmic contacting which necessitates less of a heat input than thermocompression welding and makes it possible to prevent a depolarization of the piezoelectric ceramic.

In another specific embodiment, the thermode may have a plurality of thermode heads that are jointly or individually controlled. This makes it possible to realize a sequential or parallel operation. In a sequential operation, a plurality of thermode heads may be driven in succession, while in a parallel operation, all thermode heads may be driven simultaneously. This makes the inventive method fully automatable and suited for large-scale production. Thus, a plurality of thermode heads having different-shaped contact surfaces may be structurally combined. This makes it possible to contact different 1D or 2D array layouts in only one work step. It is also possible to provide a thermode head having a plurality of contact surfaces and thereby simultaneously configure a plurality of individual transducers of an array. In the case of a complex, geometric array layout, another option is to work sequentially with a plurality of thermode heads.

The thermode may include a plurality of thermode heads, which, furthermore, may be resiliently mounted from behind numerous times, to form a one- or two-dimensional geometric configuration of a plurality of contacted piezoelectric ceramics or transducer elements. This may be accomplished in one work step. Alternatively, the transducer array may be sequentially configured with only one thermal head that is resiliently mounted from behind. In this case, the geometric configuration of the thermal head, which is resiliently mounted from behind, of the entire geometric configuration of the piezoelectric ceramics to be contacted or of the transducer elements may also be subdivided into a subgroup, and, via this thermal head subgroup, the entire configuration may be produced in sequential work steps. Alternatively, the thermal head, including subgroups, may also be configured numerous times, thereby allowing the entire layout of the piezoelectric ceramics to be contacted, or the transducer elements to be cured in one work step. The contact surfaces of the thermal head may have a symmetrical as well as a non-symmetrical design. Thus, thermal heads may be configured with purely symmetrical, purely asymmetrical, or combinations of symmetrical and asymmetrical contact surfaces. In this case, the contact surfaces may have any desired shapes or also be subdivided.

Isotropic or anisotropic conductive adhesives, as well as solder paste may be used upon forming of the durable, electrically conductive connection. In the case of solder paste, for example, the contact surface is heated to the melting point of the solder, for example, 240° C., and subsequently joined to the composite and pressed against the same. By melting the solder and homogeneously distributing the same between the flexible, electrically conductive film and the electrode of the piezoelectric ceramic, the contact surface of the thermode head may have smaller dimensions than the contact surface used for the conductive adhesives. When anisotropic conductive adhesives having spheres are used, a vertical electrical conductivity results upon heating of the composite in response to pressing thereof, until the spheres are forced into the metallic upper and lower contact partners. In this case, the contact surface is heated to temperatures of up to 250° C., which may be 190° C., and, therefore, resides below half of the Curie temperature of typical piezoelectric ceramics, in order to avoid a depolarization. When isotropic conductive adhesives are used, besides the vertical electrical conductivity between the electrode of the piezoelectric ceramic and the flexible, electrically conductive film, a vertical and horizontal conduction results. Therefore, in comparison to anisotropic conductive adhesives, short circuits may occur in the peripheral region between piezoelectric ceramics of the array. It is, therefore, advantageous to use anisotropic conductive adhesives, particularly during the manufacture of sound transducer arrays.

Heat may be introduced into the composite by regulating the thermode head or heads to a temperature that corresponds to the processing temperature of the solder paste or the curing temperature of the conductive adhesive. The pressure may be applied to the composite in a path-controlled process by bringing the thermode head into contact with the composite and pressing it as a function of a spring characteristic until the desired pressure force is reached. To avoid fracturing the ceramic, the contact force may be selected in a way that ensures that no surface forces act on the composite when the thermode head is placed thereon. The thermode head may remain in the pressed position for a retention time that may last a few seconds, for example. The thermode head may subsequently be released and placed in the starting position. Under typical process conditions, the thermode head may act on the composite of piezoelectric ceramic and of flexible, electrically conductive film between 5 and 30 seconds with a contact pressure within the range of from 1 to 2 N/mm$^2$. Thus, under the action of the contact pressure, the curing time is short, and large quantities may be achieved within a very short period of time for large-scale production.

In another specific embodiment, the flexible, electrically conductive film is connected to an electrical unit once the durable, electrically conductive connection is formed between the flexible, electrically conductive film and an electrode of the piezoelectric ceramic, or once the piezoelectric ceramic is contacted. Thus, the flexible, conductive film is connected at one end to the piezoelectric ceramic and, at the other end, to the electrical unit. In this context, the electrical unit may be used for controlling and measuring signals of the piezoelectric ceramic. Thus, the electrical unit may include components, in particular electronic components, that are mounted on the flexible, electrically conductive film, a flexible circuit board or a rigid circuit board. In this case, the flexible, electrically conductive film may have a thickness of 40 µm to 400 µm in the region of the electrical unit. In addition, the flexible circuit board may have the same flexible, electrically conductive film as the flexible, electrically conductive film used for contacting and be reinforced in the area of the components. For the contacting of the flexible or rigid circuit board, the flexible, electrically conductive film may be reinforced at the end that contacts the circuit board. Thus, in particular, printed conductors maybe provided in parallel to the circuit board, so that this section of the flexible, electrically conductive film may be plugged into an electronic component, for instance, an SMD (surface mounted device) socket connector.

Printed conductors are provided on the flexible, electrically conductive film or the flexible circuit board for the contacting of the components of the electrical unit. In addition, the electrical unit having the flexible, electrically conductive film may be configured in one or two parts. In the two-part embodiment, the contacting may take place between the flexible, electrically conductive film and the electrical unit, for example, by a conductive adhesive or a solder paste, as described above. In addition, the flexible, electrically conductive film and the electrical unit may be configured in different forms and, accordingly, be adapted to different applications. Thus, a cost-effective overall system for contacting the piezoelectric ceramic maybe provided that is "quasi" made from a casting and, thus, renders possible a rugged contacting.

The present invention also provides a sound transducer, in particular an ultrasound transducer that includes a piezoelectric ceramic, which is connected via a flexible, electrically conductive film with an electrical unit. In a specific embodiment, the sound transducer is produced using the method described above. Accordingly, the features described within the scope of the method also apply to the sound transducer. Conversely, the features described in the following also apply to the method.

The additional mass input of the contacting may be minimized by using a flexible, conductive film for contacting the piezoelectric ceramic. Consequently, the contacting only minimally influences the vibrational properties of the sound transducer, making it possible to avoid unwanted secondary effects caused by the contacting. Thus, a sound transducer is provided, which, even in large-scale production, has a low mass scattering and, thus, essentially has constant vibrational properties.

In particular, the sound transducer may be embodied as a flexural resonator or as a thickness resonator. The contacting may be carried out in the process via the rear side electrode of the piezoelectric ceramic having a metallic pot-shaped transducer, a metallic mass or a metal-plated plastic component. Furthermore, the contacting of the front side electrode and/or of the rear side electrode of the piezoelectric ceramic having rerouted contacting may be accomplished by the flexible, electrically conductive film. Rerouted contacting is understood here to mean that the one of the two electrodes of the piezoelement, that is not accessible, is routed on the piezoelement by an applied, electrically conductive track to the accessible side and is suitably widened at the end for a contacting.

Furthermore, a sound transducer array, in particular an ultrasound transducer array, that includes a plurality of sound transducers, as described above, is provided in accordance with the present invention. The sound transducer array may be a 1D or 2D array; i.e., the individual sound transducers may be disposed in a matrix having one or a plurality of rows. In addition, the individual sound transducer elements of the array may be configured symmetrically or asymmetrically.

Further aspects and advantages of the present invention shall now be described in greater detail with reference to the accompanying figures.

DETAILED DESCRIPTION

Figure 1:
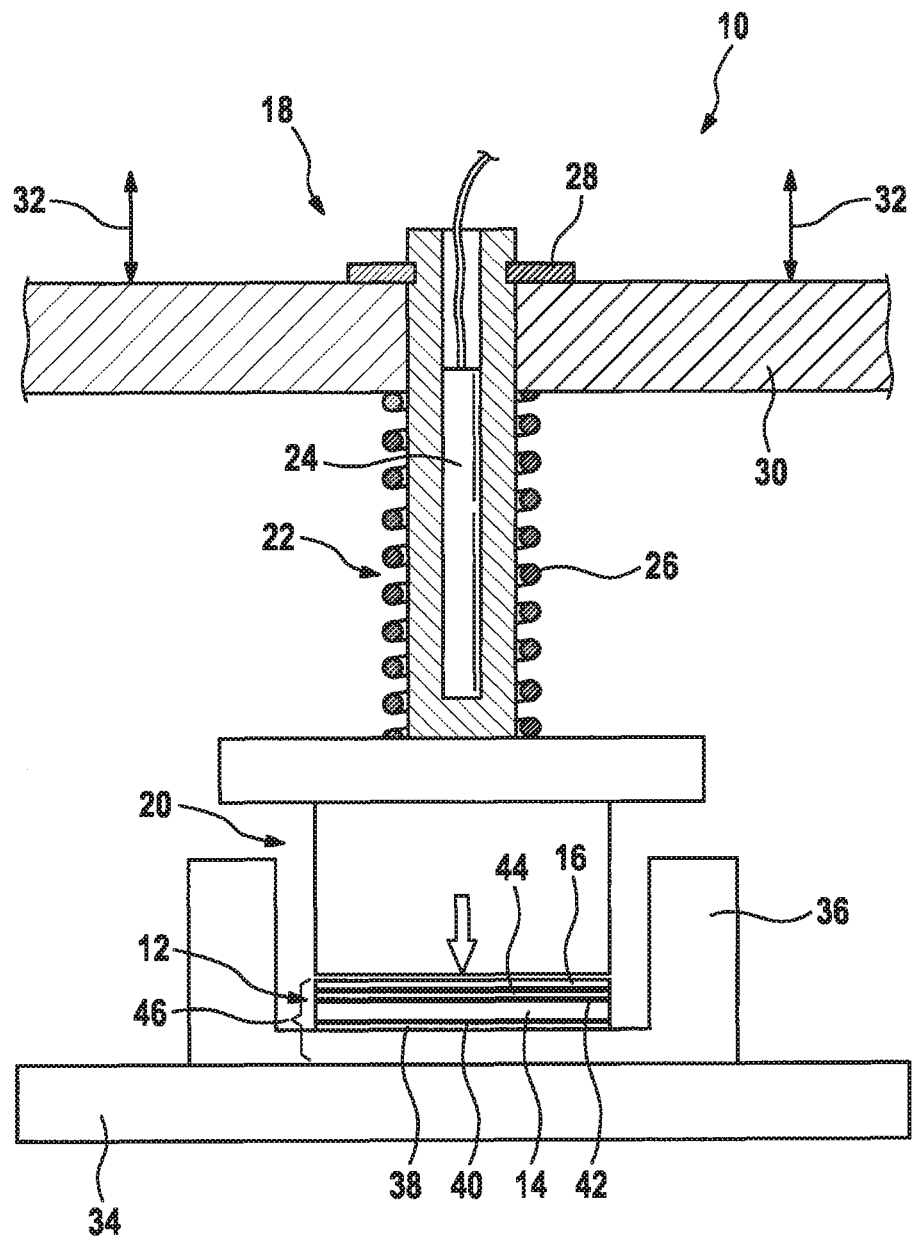
FIG. 1 shows a device for contacting a piezoelectric ceramic and an electrical sound transducer having a flexible, electrically conductive film.

FIG. 1 shows exemplarily a device 10 for contacting an electrode 40, 42 of a piezoelectric ceramic 14 having an electrically conductive, flexible film 16.

Device 10 includes a thermode 18 that has a thermode head 20. Connected to thermode head 20 is a transmission unit 22 that has a heating 24 and a preloaded compression spring 26. Transmission unit 22 is connected by a securing element 28 in a guide device 30. This enables pressure to be transmitted through guide device 30 and transmission unit 22 to heated thermode head 20. To this end, guide device 30 is movable in vertical direction 32.

To manufacture a sound transducer 12, FIG. 1 shows exemplarily the design of an ultrasound flexural transducer 12 having a piezoelectric ceramic 14. To that end, a metallic transducer element 36, in this case a metallic pot-shaped transducer, is applied to support plate 34. A conductive adhesive 38, for instance, an anisotropic or an isotropic conductive adhesive, is subsequently applied with the aid of dispensers to transducer element 36, and piezoelectric ceramic 14 is placed thereon by a vacuum gripper, for example. In this manner, once the composite has cured, an electrically conductive connection is produced between transducer element 36 and rear side electrode 40 of piezoelectric ceramic 14.

In a next step, a layer of conductive adhesive 44 is applied to front side electrode 42 of piezoelectric ceramic 14. Flexible, electrically conductive film 16, which, for example, includes a copper-coated polyimide film, is placed on this conductive adhesive layer 44 with the aid of a vacuum gripper. Thus, composite 46 composed of a transducer element 36, piezoelectric ceramic 14, and a flexible, electrically conductive film 16, is formed to the point where a durable, electrically conductive connection may be configured between the individual components.

To this end, guide device 30 is driven to produce a contact between thermode head 20 and composite 46 via transducer element 36, flexible, electrically conductive film 16 and piezoelectric ceramic 14. Annear actuator or a spindle drive maybe used for guide device 30, for example. Thus, guide device 30 may initially be driven into contact with composite 46; in response to guide device 30 continuing to move via preloaded compression spring 26, preheated thermode head 20 exerting a pressure force on composite 46, and the heat input into conductive adhesive 38, 44 taking place via the heat conduction. Accordingly, thermode head 20 may be moved into position in a time-controlled manner in such a way that conductive adhesive 38, 44 is cured in composite 46, and thus a durable, electrically conductive connection is formed between components 36, 14, 16 of composite 46.

Figure 2A:
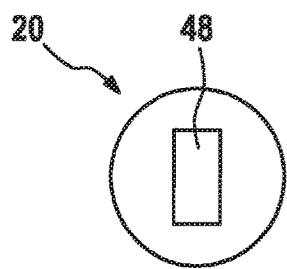
FIGS. 2a, 2b, and 2c show exemplary specific embodiments of the contact surfaces of a thermode head.
Figure 2B:
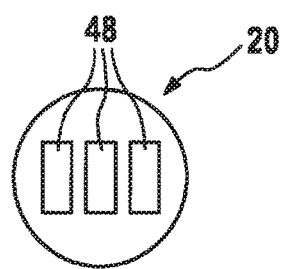
Figure 2C:
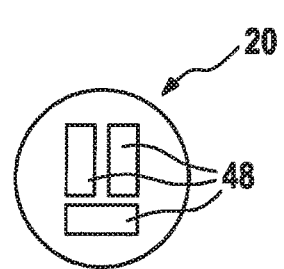

In a plan view, FIGS. 2a, 2b and 2c show different specific embodiments of a thermode head 20 that may be used in device 10 in accordance with FIG. 1, for example.

Via contact surfaces 48, thermode head 20, by the formation thereof, essentially determines the connection between the individual components of composite 46. This makes it possible for a plurality of transducer structures to be simultaneously contacted, respectively cured. FIG. 2a shows exemplarily a thermode head 20 having a single contact area 48 which realizes a transducer design having a rectangular base area. On the other hand, in FIGS. 2b and 2c, three rectangular contact surfaces 48 are formed, which may be used for simultaneously contacting three transducer structures. This type of specific embodiment having a plurality of contact surfaces 48 makes possible a regular array, as shown in FIG. 2b, or an irregular array, as shown in FIG. 2c. Upon forming one- or two-dimensional transducer arrays, it is particularly advantageous that a plurality of transducer structures be simultaneously cured.

The thermode head forms shown in FIG. 2 may also have any other desired geometric shapes. Thus, contact surfaces 48 of thermode head 20 may be round, angular, elliptical or have any other shapes or combinations of these geometric shapes. In addition, contact surfaces 48 may be uniformly or non-uniformly subdivided, which is particularly advantageous when, for example, round or rectangular piezoelectric ceramics having rerouted contacting are to be contacted.

Thus, when curing composite 46 using device 10 according to FIG. 1, different thermode heads 20 may be used that make it possible to contact an entire 1D or 2D array layout for a transducer array in one work step. In the same way, thermode heads 20 of the same type maybe combined at a somewhat larger distance to one another, it being possible for the entire head to reside in one station. This makes it possible for a plurality of individual sound transducers to be manufactured in parallel, i.e., simultaneously. If a thermode head 20 having a plurality of parallel contact surfaces 48 is used for the simultaneous contacting of a plurality of individual sound transducers of a transducer array, it may also be useful, depending on the tolerance of the transducer array, to individually resiliently mount contact surfaces 48 from behind and thereby achieve a suitable tolerance compensation.

Another option is to use one or a plurality of thermode heads 20 sequentially. To that end, support plate 34 may be driven via linear and rotary stages, and the corresponding layout portion of the transducer array may be positioned relative to particular intended thermode head 20. This does, in fact, increase the cycle time; however, greater flexibility in the layout of the array is achieved in the case of only one or two thermode heads.

The described contacting process is thus able to be fully automated and is suited for large-scale production. In addition, different sound transducer designs may be realized, for example, array sensors having flexural elements, pot-shaped transducers or thickness resonators. FIG. 3 through 8 show examples of such applications.

Figure 3A:
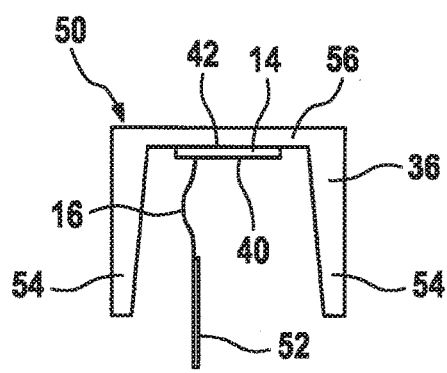
FIGS. 3a and 3b show a specific embodiment of a flexural resonator having a piezoelectric ceramic that is contacted by a flexible film.

FIG. 3a shows a flexural resonator 50 having a transducer element 36 and a piezoelectric ceramic 14 that is contacted by a flexible, electrically conductive film 16.

Flexural resonator 50 of FIG. 3a includes a transducer element 36 that has a pot-shaped form including side walls 54 and a pot bottom 56. Provided in the interior of the pot, adjoining pot bottom 56 is a piezoelectric ceramic 14 that converts the flexural vibrations of pot bottom 56 into an electrical signal. To that end, piezoelectric ceramic 14 has electrodes 40, 42 that are connected by flexible, electrically conductive film 16 to an electrical unit 52. In this context, electrical unit 52 includes elements for receiving the signals of piezoelectric ceramic 14 and for driving piezoelectric ceramic 14 to emit sound waves. In addition, the elements of electrical unit 52 are provided on a flexible, electrically conductive film that corresponds to the flexible, electrically conductive film 16 of the contacting or is configured as a rigid circuit board and is connected to the electrically conductive flex film.

Figure 3B:
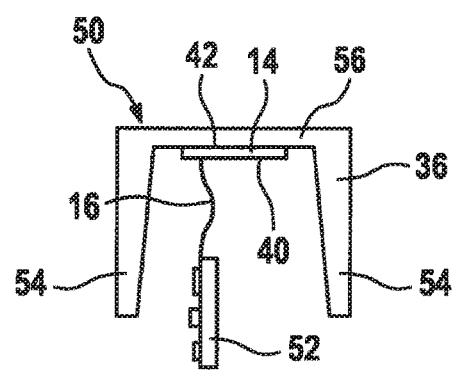

FIG. 3b shows such a further design of a flexural resonator 50 having a piezoelectric ceramic 14 that is connected via a flexible, electrically conductive film 16 to a circuit board 52.

Figure 4:
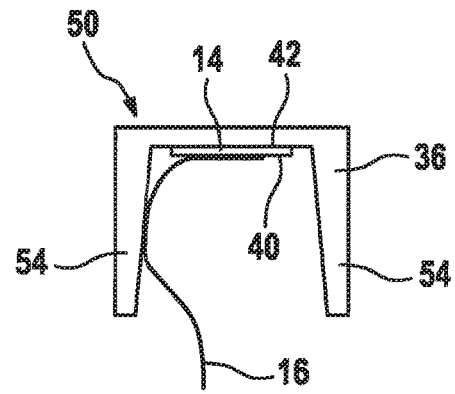
FIG. 4 show another specific embodiment of a flexural resonator having a piezoceramic that is contacted by a flexible film.

FIG. 4 shows another specific embodiment of a flexural resonator 50 having a piezoelectric ceramic 14 that is contacted via a flexible, electrically conductive film 16.

In the specific embodiment of FIG. 4, rear side electrode 40 of piezoelectric ceramic 14 and lateral surface 54 of transducer element 36 are contacted by flexible, electrically conductive film 16. Transducer element 36 is electrically conductive and directs the contacting to piezoelectric ceramic 14 or to electrode 40 thereof. It is also possible for a piezoelectric ceramic 14, having rerouted contacting, to be contacted by a flexible film 16. In this case, the two electrical terminals on the piezoelectric ceramic are each contacted by a conductor of the flex film.

Figure 5:
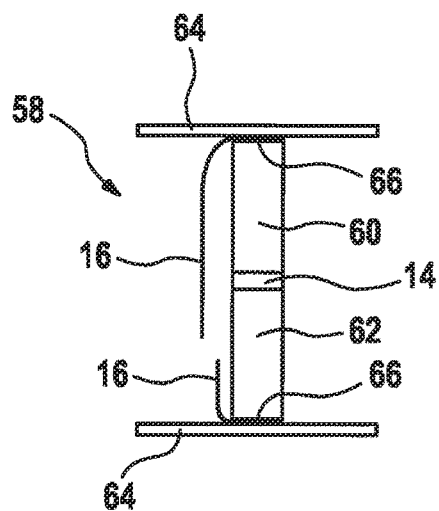
FIG. 5 show a specific embodiment of a thickness resonator whose piezoceramic is contacted by a flexible film.

FIG. 5 shows a flexural resonator 58 having a piezoelectric ceramic 14 that is contacted via a flexible, electrically conductive film 16.

It includes a front body 60 and a rear body 62 for transmitting vibrations of plates 64; a piezoelectric ceramic 14 being provided therebetween. In this specific embodiment, the contacting takes place at outer end faces 66 of front body 60 and of rear body 62 that point away from piezoelectric ceramic 14. Both front, as well as rear body 60, 62 are electrically conductive and direct the contacting of flexible, electrically conductive film 16 to piezoceramic 14 and to electrodes 40, 42 thereof. Thus, flexible, electrically conductive film 16 may establish an electrically conductive connection between piezoelectric ceramic 14, respectively electrodes 40, 42 thereof and an electrical unit 52.

Figure 6:
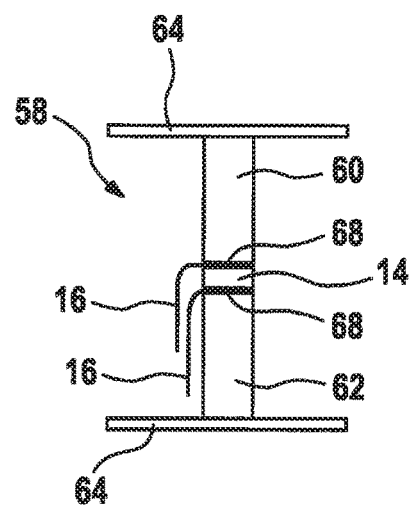
FIG. 6 show another specific embodiment of a thickness resonator having a piezoceramic that is contacted by a flexible film.

FIG. 6 shows another specific embodiment of a thickness resonator 58 and the contacting thereof.

In contrast to FIG. 5, thickness resonator 58 of FIG. 6 shows a contacting at end faces 68 of front and rear body 60, 62 that adjoin piezoelectric ceramic 14. Thus, flexible, electrically conductive film 16 may establish an electrically conductive connection between piezoelectric ceramic 14, respectively electrodes 40, 42 thereof and an electrical unit 52.

Figure 7:
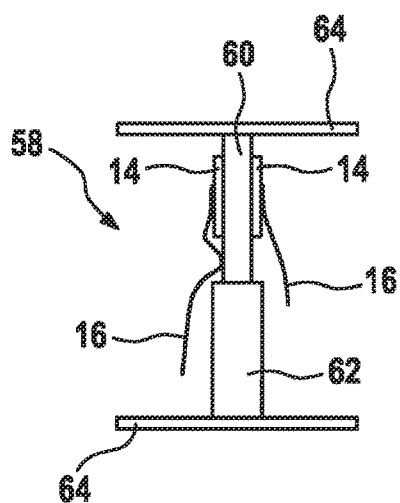
FIG. 7 show another specific embodiment of a thickness resonator having a piezoceramic that is contacted by a flexible film.

FIG. 7 shows another specific embodiment of a thickness resonator 58 that is contacted by a flexible, electrically conductive film 16.

In this case, the contacting with flexible, electrically conductive film 16 takes place via lateral surface of front body 60; piezoelectric ceramic 14 being mounted to the lateral surface of the front body. In addition, flexible, electrically conductive film 16 is electroconductively connected to the electrodes of piezoelectric ceramic 14. Front and rear bodies 60, 62 are likewise electrically conductive and direct the contacting to piezoelectric ceramic 14 or to electrodes 40, 42 thereof. Thus, one of flexible, conductive films 16 contacts electrode 40 of piezoelectric ceramic 14 and front body 60, whereas further flexible film 16 merely contacts piezoelectric ceramic 14. These two contacts may be extended further to an electrical unit 52.

Figure 8:
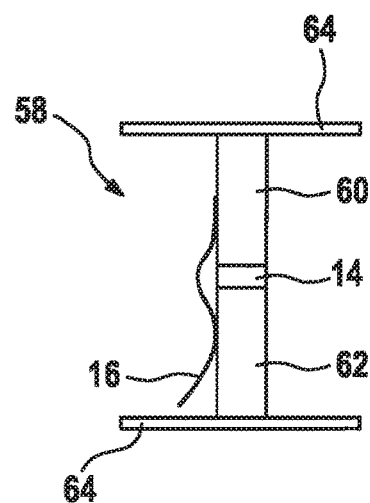
FIG. 8 show another specific embodiment of a thickness resonator having a piezoceramic that is contacted by a flexible film.

FIG. 8 shows another specific embodiment of a thickness resonator 58 that is contacted by a flexible, electrically conductive film 16.

In contrast to the specific embodiments described above, the contacting in FIG. 8 takes place via a single, flexible, electrically conductive film 16 that contacts the lateral surface of front body 60 and of rear body 62. In this context, front and rear bodies 60, 62 are electrically conductive and direct the contacting to piezoelectric ceramic 14 or to electrodes 40, 42 thereof.

The present invention is not limited to the examples described here or to the aspects emphasized herein. Rather, within the subject matter indicated by the claims, a multiplicity of further variations are conceivable that reside within the scope of expert activity.

What is claimed is:

1. A method for electrically contacting a piezoelectric ceramic, the method comprising:
    providing the piezoelectric ceramic having electrodes;
    providing a flexible, electrically conductive film;
    producing a composite by applying the flexible, electrically conductive film at least partially to an electrode of the piezoelectric ceramic;
    forming a durable, electrically conductive connection between the flexible, electrically conductive film and one of the electrodes of the piezoelectric ceramic;
    wherein, to form the composite, a conductive adhesive or a solder paste is applied between the flexible, electrically conductive film and the one of the electrodes of the piezoelectric ceramic, and
    wherein, with a thermode, heat and/or pressure is introduced into the composite to produce the durable, electrical connection between the one of the electrodes of the piezoelectric ceramic and the flexible, electrical film.

2. The method of claim 1, wherein the thermode has at least one thermode head having at least one arbitrarily shaped contact surface that is subdividable and that introduces heat and/or pressure into the composite.

3. The method of claim 1, wherein the thermode head includes a heating element for introducing heat into the composite and a rear spring for introducing pressure in the form of a contact pressure.

4. The method of claim 1, wherein the thermode has a plurality of thermode heads that are jointly or individually controlled.

5. The method of claim 1, wherein, once the durable, electrically conductive connection is formed, the flexible, electrically conductive film is connected to an electrical unit.

* * * * *